(12) United States Patent
Miura et al.

(10) Patent No.: US 10,658,811 B2
(45) Date of Patent: May 19, 2020

(54) OPTICAL COMPONENT, LIGHT EMITTING DEVICE USING THE OPTICAL COMPONENT, AND METHOD OF MANUFACTURING THE OPTICAL COMPONENT

(71) Applicant: NICHIA CORPORATION, Anan-shi, Tokushima (JP)

(72) Inventors: Soichiro Miura, Tokushima (JP); Masatsugu Ichikawa, Tokushima (JP); Takehito Shimatsu, Natori (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/129,045

(22) Filed: Sep. 12, 2018

(65) Prior Publication Data

US 2019/0081452 A1 Mar. 14, 2019

(30) Foreign Application Priority Data

Sep. 13, 2017 (JP) .................................. 2017-175891

(51) Int. Cl.
*H01S 5/022* (2006.01)
*F21V 9/30* (2018.01)
(Continued)

(52) U.S. Cl.
CPC .............. *H01S 5/022* (2013.01); *F21S 41/00* (2018.01); *F21V 7/04* (2013.01); *F21V 9/30* (2018.02);
(Continued)

(58) Field of Classification Search
CPC ........ F21Y 2115/10; F21V 5/04; F21V 15/01; G02B 6/0055; G02B 6/0073
(Continued)

(56) References Cited

U.S. PATENT DOCUMENTS 8,980,661 B2 * 3/2015 Ichikawa ............ H01L 33/0079
438/29
2008/0116473 A1 5/2008 Sugiyama
(Continued)

FOREIGN PATENT DOCUMENTS

JP 2008153617 A 7/2008
JP 2009105125 A 5/2009
(Continued)

*Primary Examiner* — Andy Huynh
(74) *Attorney, Agent, or Firm* — Hunton Andrews Kurth LLP

(57) ABSTRACT

An optical component for optical semiconductor includes a wavelength converting member including a fluorescent part having an upper surface, a lower surface, and one or more lateral surfaces, and containing a fluorescent material, and a light-reflecting part disposed adjacently surrounding the one or more lateral surfaces of the fluorescent part when viewed from above, and a light-transmissive member disposed below the wavelength converting member. A dielectric multilayer film is disposed on an upper surface of the light-transmissive member at least at a region facing the fluorescent part, the dielectric multilayer film is configured to transmit excitation light incident from below the light-transmissive member and to reflect fluorescent light emitted from the fluorescent part. Further, a space is formed between the fluorescent part and the dielectric multilayer film, and the light-reflecting part and the light-transmissive member are connected by a connecting member made of a metal material. A light emitting device including the optical component and a method of manufacturing the optical component are also provided.

20 Claims, 5 Drawing Sheets

(51) Int. Cl.
  *F21V 29/70* (2015.01)
  *F21V 7/04* (2006.01)
  *F21S 41/00* (2018.01)
  *H01S 5/00* (2006.01)
  *F21Y 115/30* (2016.01)
  *H01S 5/40* (2006.01)

(52) U.S. Cl.
  CPC .............. *F21V 29/70* (2015.01); *H01S 5/005* (2013.01); *H01S 5/02288* (2013.01); *H01S 5/02292* (2013.01); *H01S 5/02296* (2013.01); *F21Y 2115/30* (2016.08); *H01S 5/4025* (2013.01)

(58) Field of Classification Search
  USPC .......................................................... 257/79
  See application file for complete search history.

(56) References Cited

U.S. PATENT DOCUMENTS

| | | | | |
|---|---|---|---|---|
| 2013/0049564 | A1* | 2/2013 | Jung | H01S 5/02469 313/45 |
| 2015/0188004 | A1* | 7/2015 | Ozeki | H01L 33/507 257/98 |
| 2015/0292687 | A1 | 10/2015 | Sugiyama | |
| 2016/0091171 | A1 | 3/2016 | Okada | |
| 2016/0190418 | A1* | 6/2016 | Inomata | H01L 33/644 257/98 |
| 2017/0054270 | A1 | 2/2017 | Okada | |
| 2018/0006430 | A1 | 1/2018 | Okada | |

FOREIGN PATENT DOCUMENTS

| | | |
|---|---|---|
| JP | 2014154723 A | 8/2014 |
| JP | 2015207755 A | 11/2015 |
| JP | 2016072513 A | 5/2016 |

\* cited by examiner

OPTICAL COMPONENT, LIGHT EMITTING DEVICE USING THE OPTICAL COMPONENT, AND METHOD OF MANUFACTURING THE OPTICAL COMPONENT

CROSS-REFERENCE TO RELATED PATENT APPLICATION

The present application claims priority under 35 U. S. C. § 119 to Japanese Patent Application No. 2017-175891, filed Sep. 13, 2017. The contents of this application are incorporated herein by reference in their entirety.

BACKGROUND

Technical Field

The present disclosure relates to an optical component, a light emitting device using the optical component, and a method of manufacturing the optical component.

Description of Related Art

A light emitting device having a semiconductor laser element and a wavelength converting member is disclosed, for example, in Japanese Unexamined Patent Application Publication No. 2014-154723, which also describes the use of the light emitting device in a vehicle lamp.

SUMMARY

Such a conventional light emitting device employing a semiconductor laser element as its light source has a room for improving the efficiency in light extraction from the wavelength converting member to improve the luminance of the light emitting device.

Accordingly, an object of certain embodiments of the present disclosure is to provide an optical component having a wavelength converting member through which incident light from, for example, a semiconductor laser element can be emitted with high light extraction efficiency.

Another object of certain embodiments of the present disclosure is to provide a light emitting device having a semiconductor laser element and a wavelength converting member, in which light from the semiconductor laser element is emitted through the wavelength converting member with high light extracting efficiency and high luminance.

An optical component according to an aspect of the present invention includes a wavelength converting member and a light-transmissive member disposed under the wavelength converting member. The wavelength converting member includes a fluorescent part and a light-reflecting part. The fluorescent part has an upper surface, a lower surface, and one or more lateral surfaces, and contains a fluorescent material. The light-reflecting part is disposed adjacent to the one or more lateral surfaces of the fluorescent part such that when viewed from above, the light-reflecting part surrounds the fluorescent part. A dielectric multilayer film is disposed on an upper surface of the light-transmissive member at least at a region opposite to the fluorescent part, and is configured to allow light that enters the light-transmissive member from below to pass through while reflecting fluorescent light emitted from the fluorescent part. Further, a space is formed between the fluorescent part and the dielectric multilayer film. The light-reflecting part and the light-transmissive member are connected through a connecting member made of a material that is different from a material of the light-reflecting part.

A light emitting device according to another aspect of the present invention includes the optical component described above and a semiconductor laser element to emit an excitation light to a lower surface of the light-transmissive member.

A method of manufacturing an optical component according to another aspect of the present invention includes providing a wavelength converting member, providing a light-transmissive member to be disposed under the wavelength converting member, and bonding the wavelength converting member and the light-transmissive member. The providing the wavelength converting member is to provide a wavelength converting member that includes a fluorescent part having an upper surface, a lower surface, and one or more lateral surfaces, and containing a fluorescent material, and a light-reflecting part disposed adjacent to the one or more lateral surfaces of the fluorescent part such that when viewed from above, the light-reflecting part surrounds the fluorescent part, and a metal layer is disposed on a lower surface of the light-reflecting part. The providing the light-transmissive member is to provide a light-transmissive member, a dielectric multilayer film disposed on an upper surface of the light-transmissive member at least at a region opposite to the fluorescent part, and is configured to allow light that enters the light-transmissive member from below to pass through while reflecting fluorescent light emitted from the fluorescent part, and a metal layer disposed on an upper surface of the light-transmissive member at above a region opposite to the light-reflecting part. The connecting the wavelength converting member and the light-transmissive member is to connect the metal layer disposed on the wavelength converting member and the metal layer disposed on the light-transmissive member by using an atomic diffusion bonding technique such that a space filled with a gas is formed between the dielectric multilayer film disposed on the light-transmissive member and the fluorescent part.

DETAILED DESCRIPTION

Certain embodiments of the present invention will be described below with reference to the drawings. The embodiments shown below are intended as illustrative to give a concrete form to technical ideas of the present invention, and the scope of the invention is not limited to those described below. The drawings referred to in the description below are to schematically illustrate the embodiments, and the size, a space or interval, locational relationship of the components may be exaggerated or a portion of a component may not be shown.

First Embodiment

Figure 1:
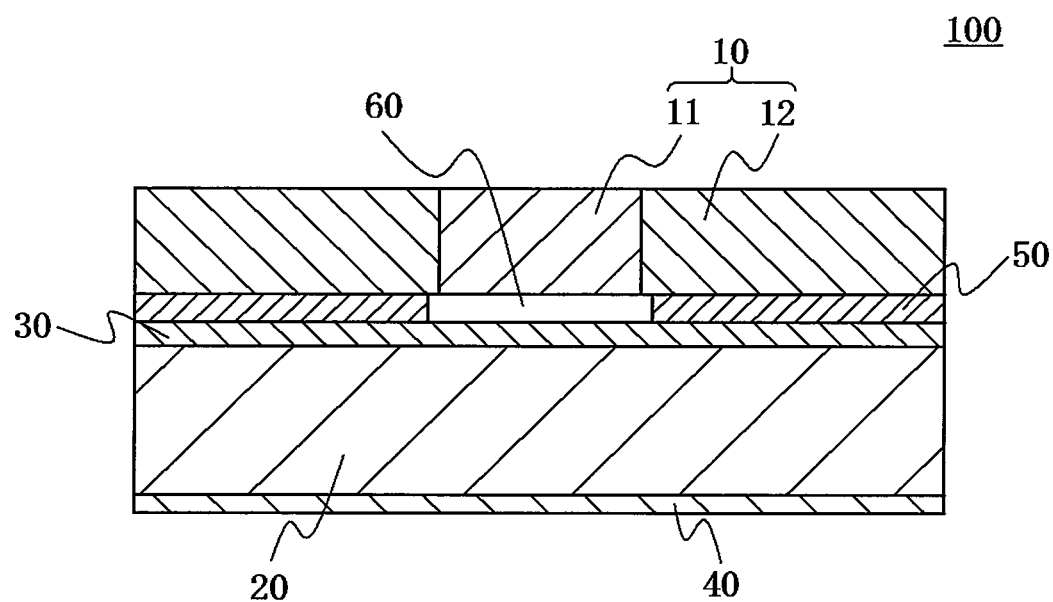
FIG. 1 is a cross-sectional view of an optical component according to a first embodiment of the present invention.
Figure 2:
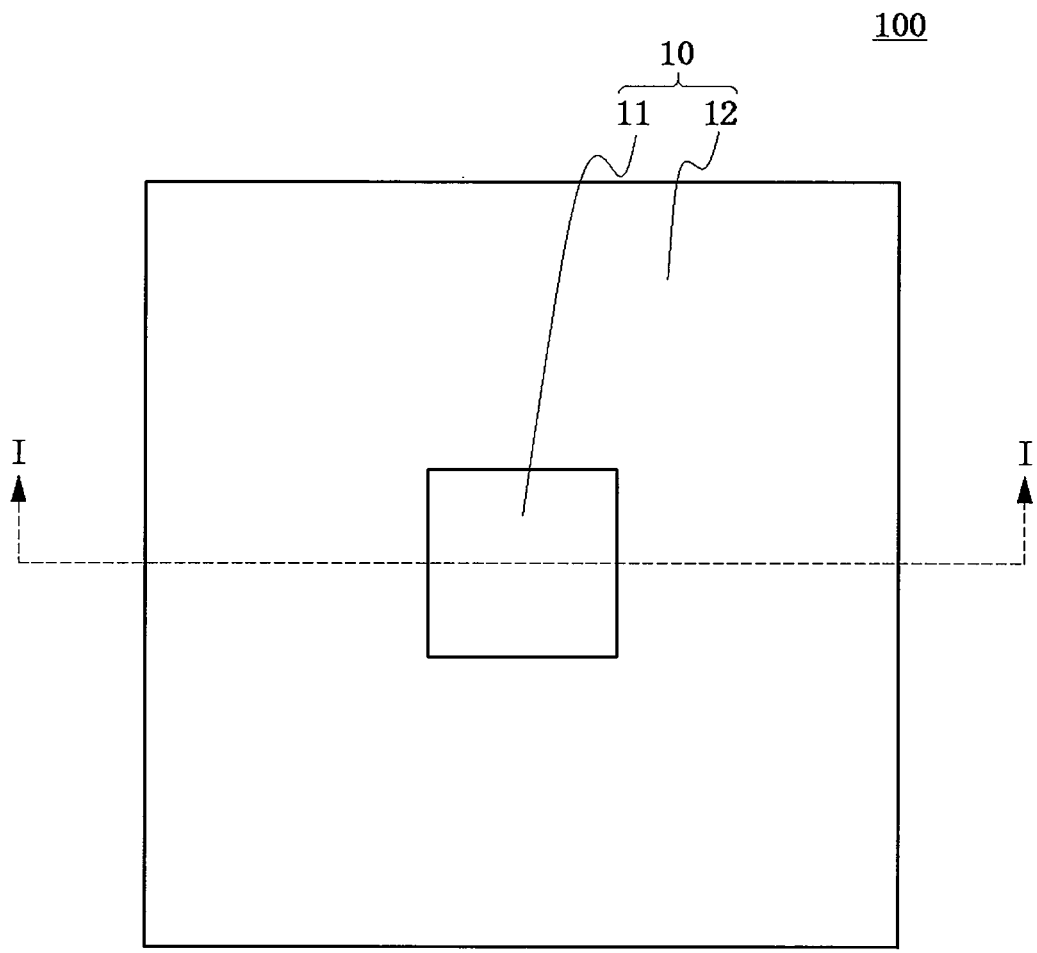
FIG. 2 is a top view of an optical component according to the first embodiment of the present invention.

FIG. 1 is a cross-sectional view of an optical component 100, and FIG. 2 is a top view of the optical component 100 according to the first embodiment of the present invention. FIG. 1 is a cross sectional view taken along line I-I of FIG. 2.

As shown in FIG. 1 and FIG. 2, the optical component 100 includes:

(a) a wavelength converting member 10 that includes a fluorescent part 11 and a light-reflecting part 12, and.

(b) a light-transmissive member 20 disposed under the wavelength converting member 10.

The fluorescent part 11 has an upper surface (as a light emitting surface), a lower surface (as a light-incident surface), and lateral surfaces, and contains a fluorescent material. The light-reflecting part 12 is disposed adjacent to the one or more lateral surfaces of the fluorescent part such that when viewed from above, the light-reflecting part surrounds the fluorescent part.

The optical component 100 further includes a dielectric multilayer film 30 disposed between the wavelength converting member 10 and the light-transmissive member 20, opposite to the light-incident surface of the fluorescent part 11, and a space 60 is formed between the fluorescent part 11 and the dielectric multilayer film 30. The light-reflecting part 12 and the light-transmissive member 20 are connected through a connecting member 50 made of a material that is different from a material of the light-reflecting part 12. In the optical component 100, the dielectric multilayer film 30 is configured to allow light (excitation light) that excites the fluorescent material contained in the fluorescent part 11 to pass through and to reflect light (fluorescent light) emitted from the fluorescent material.

In the optical component 100 having a structure described above, light (excitation light) that excites the fluorescent material in the fluorescent part 11 is made incident on the fluorescent part 11 through the light-transmissive member 20, the dielectric multilayer film 30, and the space 60, and light (fluorescent light) emitted from the fluorescent material of the fluorescent part 11 is emitted from the light emission surface of the fluorescent part 11. The light emitted from the light emission surface of the fluorescent part 11 may include a portion of excitation light passing through the fluorescent part 11 without absorbed by the fluorescent material. Accordingly, light emitted from the optical component 100 has a color that is different from the color of the incident light. When the excitation light is not substantially emitted from the light emission surface of the fluorescent part 11, the color of the light emitted from the light emission surface of the fluorescent part 11 is the color of the light (fluorescent light) emitted from the fluorescent material. When a portion of the excitation light is emitted from the light emission surface of the fluorescent part 11, the color of the light emitted from the light emission surface of the fluorescent part 11 is a mixed color of the excitation light and the fluorescent light.

The optical component 100 having a structure described above includes the dielectric multilayer film 30 between the fluorescent part 11 and the light-transmissive member 20, which can increase luminance of light emitted from the light emission surface of the fluorescent part 11, and further the space 60 that is provided between the fluorescent part 11 and the dielectric multilayer film 30 can further increase the luminance of light emitted from the light emission surface of the fluorescent part 11. The mechanism thereof will be described below.

With the light-reflecting part 12 surrounding the fluorescent part 11, the excitation light scattered at the fluorescent part 11 and the fluorescent light emitted from the fluorescent part 11 can be reflected at the light-reflecting part 12 and emitted upward, which can increase the brightness when viewed from above (hereinafter, "excitation light" and "fluorescent light" may be collectively referred to as "light"). Portions of light reflected at the light-reflecting part 12 and scattered at the fluorescent material propagate not only upward but downward as well. Accordingly, a dielectric multilayer film 30, which is configured to allow excitation light entering from below the light-transmissive member 20 to pass through and to reflect fluorescent light emitted from the fluorescent part 11, is provided on the upper surface of the light-transmissive member 20 located below the fluorescent part 11. The light propagating downward from the fluorescent part 11 can be reflected at the dielectric multilayer film 30 and extracted upward. However, a reflectance of a dielectric multilayer film is dependent on an incident angle. For example, the dielectric multilayer film exhibits a high reflectance to light of an incident angle close to 0° (i.e., incident substantially perpendicularly), but a lower reflectance to light of an incident angle close to 45°. Accordingly, in the optical component 100, the light-reflecting part 12 and the light-transmissive member 20 are connected by a connecting member 50 made of a material different from the material of the light-reflecting part 12, and further, a space 60 is formed between the fluorescent part 11 and the dielectric multilayer film 30. With this configuration, light incident from the fluorescent part 11 with an angle of incident equal to or greater than the critical angle is totally reflected at the interface between the fluorescent part 11 and the space 60. For example, when the fluorescent part 11 has a refractive index of about 1.8, the critical angle at the interface between the fluorescent part 11 and the space 60 is about 33°. Thus, in the optical component 100, light propagating downward from the fluorescent part 11 can be reflected upward at the interface between the fluorescent part 11 and the space 60 and at the dielectric multilayer film 30. Thus, although relatively simple in configuration, an improvement in the luminance can be achieved.

Simulation results also indicated that the luminance emitted from the light emission surface is increased with the use of the optical component 100 that includes the dielectric multilayer film 30 and the space 60. The details and results of the simulation will be described in detail below.

Reflectance of light propagating downward in the fluorescent part 11 (the reflectance includes reflections at the interface between the fluorescent part 11 and the space 60, and reflections at the dielectric multilayer film 30) with and without the space 60 between the incident surface of the fluorescent part 11 and the dielectric multilayer film 30 were determined by the simulation.

Figure 3:
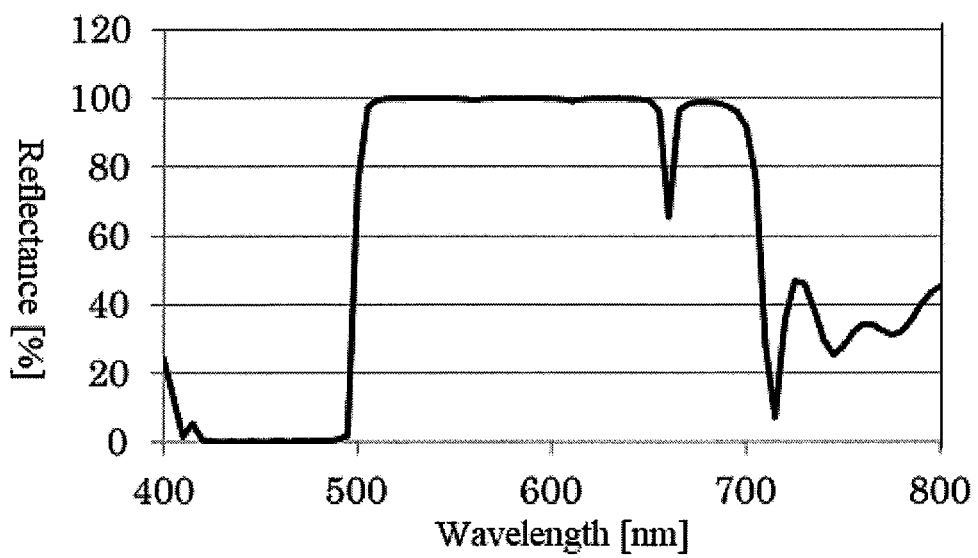
FIG. 3 is a graph showing reflectance to wavelength of light incident perpendicularly to the dielectric multilayer film of an optical component according to the first embodiment.

Assuming the use of a dielectric multilayer film that exhibits reflectance to wavelengths of perpendicularly incident light as shown in FIG. 3, the simulation was performed at wavelengths of 450 nm, 550 nm, 600 nm, and 650 nm with respect to each of the refractive indexes of the fluorescent part 11 of 1.1, 1.3, 1.5, 1.7, and 1.9, to estimate the synthetic reflectance over the entire range of incident angles.

The simulation was performed with the assumption provided below.

1. The refractive index of the fluorescent part 11 does not exhibit wavelength dependency.
2. The refractive index of the space 60 is 1.
3. The intensity of the beam incident on the interface between the fluorescent part 11 and the space 60 or the dielectric multilayer film 30 follows the Lambertian distribution, that is, proportional to cosine of the incident angle.

The results of the simulation performed with the conditions and assumption described above are shown in Table 1.

TABLE 1

| Wavelength (nm) | Space Presence (P) or absence (A) | | Refractive index of fluorescent part | | | | |
|---|---|---|---|---|---|---|---|
| | | | 1.1 | 1.3 | 1.5 | 1.7 | 1.9 |
| 450 | P | Reflectance | 0.298705 | 0.406773 | 0.484762 | 0.544312 | 0.590339 |
| 550 | P | Reflectance | 0.972183 | 0.975732 | 0.978664 | 0.982858 | 0.984575 |
| 600 | P | Reflectance | 0.934035 | 0.942003 | 0.950001 | 0.954868 | 0.958532 |
| 650 | P | Reflectance | 0.780177 | 0.811487 | 0.837953 | 0.854863 | 0.86989 |
| 450 | A | Reflectance | 0.230099 | 0.230099 | 0.230099 | 0.230099 | 0.230099 |
| 550 | A | Reflectance | 0.96897 | 0.96897 | 0.96897 | 0.96897 | 0.96897 |
| 600 | A | Reflectance | 0.924677 | 0.924677 | 0.924677 | 0.924677 | 0.924677 |
| 650 | A | Reflectance | 0.755213 | 0.755213 | 0.755213 | 0.755213 | 0.755213 |

The reflectances shown in Table 1 are synthetic reflectance over the entire range of incident angles. In the present specification, the term "synthetic reflectance of all incident angles" refers to a value obtained such that reflectances at the interface between the fluorescent part and the space and at the dielectric multilayer film with respect to the respective incident angles are multiplied with the relative intensity at the respective incident angles under the assumption that light propagating downward in the fluorescent part follows Lambertian distribution, and the values obtained were added.

As shown in Table 1, at any refractive index and any wavelength, cases provided with the space exhibited higher refractive indexes than cases without the space. The simulation results also indicated that the higher the refractive index of the fluorescent part, the greater the ratio of increasing the refractive index. This is considered that, because the higher the refractive index of the fluorescent part, the higher the reflectance, reflection at the interface between the fluorescent part and the space contribute to improve the reflectance.

Each member constituting the optical component 100 will be described in detail below.

Wavelength Converting Member 10

The wavelength converting member 10 includes the fluorescent part 11 and the light-reflecting part 12. The light-reflecting part 12 is disposed adjacent to one or more lateral sides (lateral periphery) of the fluorescent part 11 such that when viewed from above, the light-reflecting part 12 surrounds the fluorescent part 11.

The fluorescent part 11 contains a fluorescent material. The fluorescent part 11 is formed with, for example, a fluorescent material dispersed in a binder such as alumina. The fluorescent material can be selected from various kinds of fluorescent materials, according to the use of the optical component 100, type and wavelength of the excitation light source used to excite the fluorescent material. The material of the binder can be selected from various ceramics materials and resin materials, according to the fluorescent material to be used and the materials of that constitute the optical component 12. Examples of the fluorescent material include a yttrium aluminum garnet (YAG)-based fluorescent material activated with cerium, a lutetium aluminum garnet (LAG)-based fluorescent material activated with cerium, a nitrogen-containing calcium aluminosilicate (CaO—$Al_2O_3$—$SiO_2$) activated with europium and/or chromium, a silicate (($Sr,Ba)_2SiO_4$) activated with europium, an α-sialon-based fluorescent material, a β-sialon-based fluorescent material, and a KSF ($K_2SiF_6$:Mn)-based fluorescent material. Among those, a YAG-based fluorescent material that has good heat-resisting properties is preferable. Optical energy of a semiconductor laser element concentrates in a narrower range compared to that of a semiconductor diode element and has higher optical density. Thus, when a semiconductor laser element is used as an excitation light source of the fluorescent material, which tends to cause a high temperature in the fluorescent part 11. However, because the YAG-based fluorescent materials have good thermal characteristics, degradation of the fluorescent material can be reduced even when the semiconductor laser element is used as the excitation light source.

The fluorescent part 11 may have a single layer or a multilayer structure. When the fluorescent part 11 of a multilayer structure is employed, the lowermost layer that is exposed to the excitation light easily generate heat. For this reason, a YAG-based phosphor that has good thermal properties is preferably used for the lowermost layer.

The fluorescent part 11 may contain an organic material but is preferably made of an inorganic material. Compared to an organic material such as a resin, an inorganic material has higher thermal resistance and/or optical resistance, which can facilitate an improvement in the reliability. Examples of the fluorescent part 11 made of an inorganic material include a polycrystal of a fluorescent material obtained by sintering fluorescent material particles, and a single crystal of a fluorescent material. Examples of the fluorescent part 11 made of an inorganic material may also include a composite of a binder such as $Al_2O_3$ and a fluorescent material. When the light-reflecting part 12 to be described below includes alumina as its main component, a material that contains alumina as its main component is preferably used as a binder. The binder can be made of a composite material that contains a material of high refractive index such as zirconia in addition to alumina. Compared to a binder made singly of aluminum, the refractive index of the fluorescent part 11 can be increased. As shown by the simulation described above, higher reflectance can be realized in a structure that includes the dielectric multilayer film 30 and the space 60.

As described above, when the fluorescent part 11 contains a YAG-based fluorescent material and aluminum as a binder, the light-reflecting part 12 is preferably made of a sintered alumina (ceramics). That is, the binder of the fluorescent part 11 and the main material of the light-reflecting part 12 are preferably made of the same inorganic material, and thus the fluorescent part 11 and the light-reflecting part 12 can be easily integrated. For example, when the fluorescent part 11 contains a YAG-based fluorescent material and alumina, and the light-reflecting part 12 contains alumina, the fluorescent part 11 and the light-reflecting part 12 can be integrally formed by sintering. The one or more lateral surfaces of a fluorescent material ceramics that is the fluorescent part 11 and the light-reflecting ceramics that is the light-reflecting part 12 may be directly in contact with each other.

When a sintered body such as sintered alumina is used to form the light-reflecting part 12, a plurality of voids can be created in the light-reflecting part 12 by controlling the sintered temperature or the like, and thus light can be scattered at the interfaces between alumina and voids. Accordingly, high optical reflectance can be obtained at the light-reflecting part 12.

As shown in FIG. 2, in the optical component 100, the wavelength converting member 10 has a rectangular peripheral shape in a top view, but the wavelength converting member 10 may have other peripheral shape such as a circular shape. When the peripheral shape of the wavelength converting member 10 is rectangle, the length of a side may be in a range of 0.5 mm to 20 mm, preferably in a range of 2 mm to 5 mm. When the peripheral shape of the wavelength converting member 10 is substantially circular, the diameter may be in a range of 0.5 mm to 20 mm, preferably in a range of 2 mm to 5 mm.

As shown in FIG. 2, in the optical component 100, the fluorescent part 11 has a substantially square peripheral shape in a top view, but the fluorescent part 11 may have other peripheral shape such as a substantially circular shape. When the peripheral shape of the fluorescent part 11 is substantially square, the length of a side may be in a range of 0.1 mm to 5 mm, preferably in a range of 0.05 mm to 3 mm. When the peripheral shape of the fluorescent part 11 is substantially circular, the diameter may be in a range of 0.1 mm to 5 mm, preferably in a range of 0.05 mm to 3 mm.

The fluorescent part 11 and the light-reflecting part 12 respectively have a thickness of, for example, 0.1 mm to 3 mm, preferably 0.2 mm to 1 mm.

Light-Transmissive Member 20

For the light-transmissive member 20, quartz, SiC, sapphire, or a sintered body (ceramics) of aluminum nitride or the like, can be used. In view of light-transmissive property, strength, and heat dissipation properties, sapphire is particularly preferably used. In the present embodiment, the light-transmissive member 20 has the same outer peripheral shape as that of the wavelength converting member 10 in a top view, but may have a different outer peripheral shape.

The light-transmissive member 20 may have a thickness, for example, in a range of 0.1 mm to 5 mm, preferably in a range of 0.2 mm to 1 mm.

Dielectric Multilayer Film 30

A dielectric multilayer film 30, having characteristics for example shown in FIG. 3, is disposed on the upper surface of the light-transmissive member 20. The dielectric multilayer film 30 is configured to transmit the excitation light to excite the fluorescent material contained in the fluorescent part 11 and to reflect the fluorescent light emitted from the fluorescent material. The dielectric multilayer film 30 may be formed with alternatively layered at least two dielectric films of different refractive index: a first dielectric film and a second dielectric film, and reflecting property with a desired transmitting wavelength range and reflecting wavelength range can be obtained by appropriately adjusting the refractive index and the thickness of the first dielectric films and the second dielectric films. In the optical component 100, the reflecting property of the dielectric multilayer film 30 can be designed according to the use of the optical component. With the dielectric multilayer film 30, the excitation light made incident from below can be transmitted while efficiently reflecting the fluorescent light emitted from the fluorescent part 11. When the optical component 100 is used in combination of the semiconductor laser element that serves as a light source, due to highly rectilinear propagation characteristics of the laser light emitted from the semiconductor laser element, the laser light can be made perpendicularly incident to the dielectric multilayer film 30 and the incident light can be efficiently made incident to the fluorescent part 11. The dielectric multilayer film 30 is configured such that the excitation light perpendicularly incident to the dielectric multilayer film 30 is easily transmitted and the reflecting wavelength band is such that the excitation light obliquely incident to the dielectric multilayer film 30 is easily reflected. By using those properties, appropriately setting the transmittance and the reflectance of the dielectric multilayer film 30 with respect to certain wavelength to obtain high transmittance to perpendicularly incident laser light and high reflectance to light of incident angles other than perpendicular, the laser light can be made efficiently incident to the fluorescent part 11 and higher light extracting efficiency of the light from the fluorescent part 11 can be realized. Accordingly, the use of the optical component 100 in combination with the semiconductor laser element allows for efficient use of the laser light in exciting the fluorescent material.

The dielectric multilayer film 30 may be formed by layering at least two kinds of dielectric films; a first dielectric multilayer film and a second dielectric multilayer film, each respectively selected from silicon oxide, niobium oxide, aluminum oxide, aluminum nitride, titanium oxide, titanium oxide, etc.

The number of the first dielectric film and the second dielectric film constituting the dielectric multilayer film 30 can be respectively, for example, in a range of 20 to 70, preferably in a range of 30 to 50. The thickness of each layer of the first dielectric film and the second dielectric film can be, for example, in a range of 0.01 μm to 2 μm, more preferably in a range of 0.02 μm to 1.5 μm.

To the excitation light perpendicularly incident to the dielectric multilayer film 30 from below, the dielectric multilayer film 30 preferably has a transmittance of, for example, 90% or greater, more preferably of 95% or greater. To the fluorescent light perpendicularly incident to the dielectric multilayer film 30 from above, the dielectric multilayer film 30 also preferably has a reflectance of, for example, 90% or greater, preferably 95% or greater.

Antireflection Film 40

In the optical component 100, an antireflection film 40 is disposed on the lower surface of the light-transmissive member 20. The antireflection film 40 is optional, but it is preferable to dispose the antireflection film 40. With the use of the antireflection film 40, the excitation light incident from below can be efficiently incident to the light-transmissive member 20. The antireflection film 40 may be a multilayer film formed by layering at least two kinds of dielectric layers selected from silicon oxide, niobium oxide, aluminum oxide, aluminum nitride, titanium oxide, titanium oxide, etc. The antireflection film 40 may prevent or reduce the reflection of the excitation light incident from below.

The number of each of the at least two kinds of layers constituting the antireflection film 40 can be, for example, in a range of 2 to 10, preferably in a range of 3 to 6. The thickness of each layer can be, for example, in a range of 0.01 µm to 2 µm, preferably in a range of 0.02 µm to 1.5 µm.

To the excitation light perpendicularly incident to the antireflection film 40 from below, the antireflection film 40 preferably has a transmittance of, for example, 90% or greater, more preferably of 95% or greater.

Connecting Member 50

Figure 5:
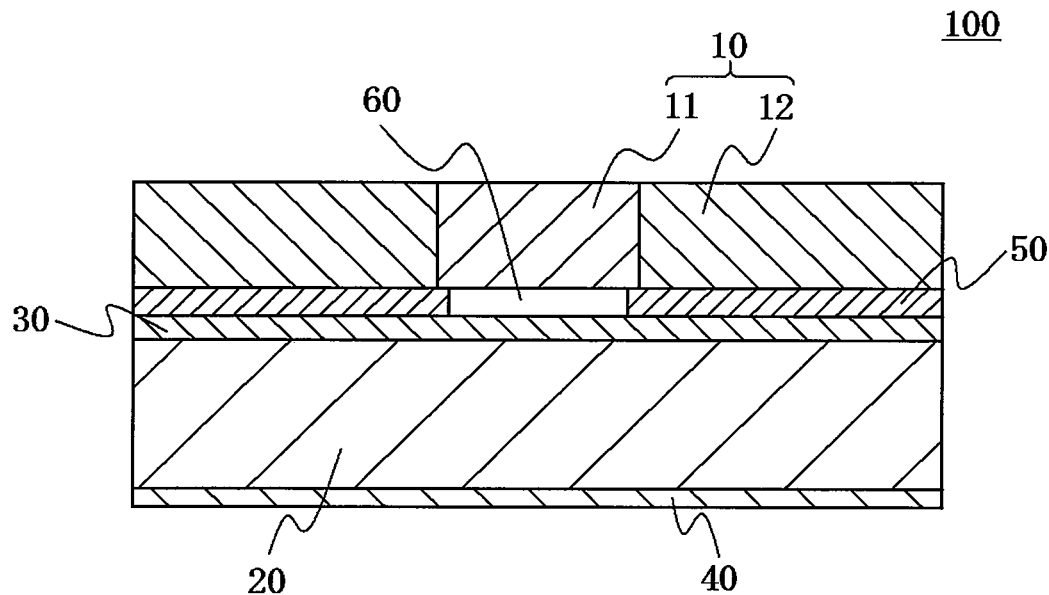
FIG. 5 is a schematic cross-sectional view of another optical component according to a first embodiment of the present invention.

The wavelength converting member 10 and the light-transmissive member 20 are connected through a connecting member 50 made of a material that is different from a material of the light-reflecting part 12. In the optical component 100, the connecting member 50 is disposed between the light-reflecting part 12 and the light-transmissive member 20, and is not disposed under the fluorescent part 11. Accordingly, in the optical component 100, a space 60 is formed under the fluorescent part 11 at a place where the connecting member 50 is not disposed, thus, a lower surface of the fluorescent part 11 and an upper surface of the dielectric multilayer film 30 are facing each other at an interval equivalent to the thickness of the connecting member 50. The connecting member 50 may also be provided, as shown in FIG. 5, to a region under the fluorescent part 11 except where a portion of the excitation light having high optical intensity propagates. That is, in the optical component 100, the space 60 is formed at least in a region where a portion of the excitation light having high optical intensity propagates. In FIG. 1, in order to facilitate adjusting the thickness of the space 60 (i.e., a distance in up/down direction in FIG. 1), the light-reflecting part 12 and the light-transmissive member 20 are connected by the connecting member 50 via the dielectric multilayer film 30, but the connecting member 50 may be provided directly in contact to the light-reflecting part 12 and the light-transmissive member 20.

As described above, with the use of the connecting member 50, the space 60 can be relatively easily formed. The space 60 may be made into vacuum, but is preferably filled with a gas. If the space 60 is made into vacuum or in a near-vacuum state, the thermal conductivity of the space 60 is substantially zero. But filling the space 60 with a gas can increase the thermal conductivity of the space 60. For example, at zero degrees Celsius, the thermal conductivity (W/(m K)) of argon is approximately 0.002, air is approximately 0.024 (to which the thermal conductivity of oxygen and nitrogen are substantially the same), hydrogen is approximately 0.17, and helium is approximately 0.14. As shown above, helium, which has a relatively high thermal conductivity and is safe to use and for people, is preferably filled in the space 60. Accordingly, heat generated in the fluorescent part 11 can be efficiently dissipated.

When the space 60 is filled with a gas, the thinner the space 60, the greater the heat dissipation. Accordingly, the thickness of the space 60 (i.e., the distance between the upper surface of the dielectric multilayer film 30 and the lower surface of the fluorescent part 11) is preferably 5 µm or less, more preferably 3 µm or less. In order to improve the reflectance by forming the space 60, the thickness of the space 60 is preferably equal to or greater than the peak wavelength ($\lambda$) of the excitation light, more preferably equal to or greater than 1 µm. As described above, with the thickness of the space 60 in the range shown above, both reflection of light and heat dissipation can be obtained at the interface between the fluorescent part 11 and the space 60.

Figure 4:
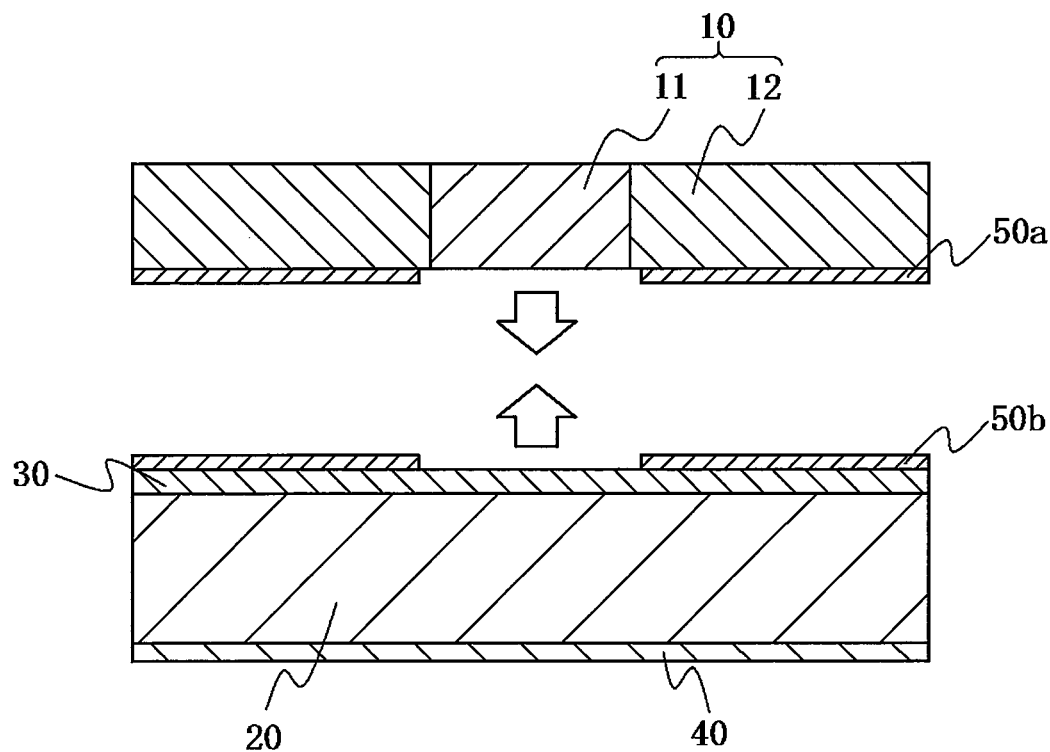
FIG. 4 is a diagram illustrating a method of manufacturing an optical component according to the first embodiment of the present invention.

Next, with reference to FIG. 4, an example of a method of connecting the wavelength converting member 10 and the light-transmissive member 20 with the use of the connecting member 50 will be illustrated.

First, providing the wavelength converting member 10 that includes the fluorescent part 11 having an upper surface, a lower surface, and one or more lateral surfaces, and containing a fluorescent material, and the light-reflecting part 12 disposed adjacent to the one or more lateral surfaces of the fluorescent part 11 such that when viewed from above, the light-reflecting part 12 surrounds the fluorescent part 11, and a metal layer 50a is disposed on the lower surface of the light-reflecting part 12.

Subsequently, providing the light-transmissive member 20 that will be disposed under the wavelength converting member 10 in a later step. In this step, the light-transmissive member 20 is provided such that the dielectric multilayer film 30 is disposed on the upper surface of the light-transmissive member 20 at least at a region facing the fluorescent part 11. The dielectric multilayer film 30 is configured to transmit the excitation light incident to the light-transmissive member 20 from below, and to reflect fluorescent light emitted from the fluorescent part 11. Also, the metal film 50b is disposed on the upper surface of the light-transmissive member 20 at a region opposite to the light-reflecting part 12. The step of providing the light-transmissive member 20 may be performed before the step of providing the wavelength converting member 10.

Subsequently, connecting the metal layer 50a disposed on the wavelength converting member 30 and the metal layer 50b disposed on the light-transmissive member 20 by using an atomic diffusion bonding technique such that the space 60 filled with a gas is formed between the dielectric multilayer film 30 disposed on the light-transmissive member 20 and the fluorescent part 11. The metal layer 50a and the metal layer 50b may be directly bonded by using a technique such as ultrasonic bonding or thermo-compression bonding, other than the atomic diffusion bonding technique. The metal layer 50a and the metal layer 50b may be bonded by using a solder such as AuSn, metal sub-micron particles such as Au sub-micron particles, or nano-metal particles. In the present disclosure, the term "nano-metal particles" refers to metal particles having an average particle size in a range of 1 nm to 100 nm, and the term "sub-micron metal particles" refers to metal particles having an average particle size in a range of 101 nm to 1 µm.

When atomic diffusion bonding technique is used, the thickness of the connecting member 50 after bonding can be controlled with high reproducibility to a relatively small thickness. Further, atomic diffusion bonding technique does not require vacuum for bonding, and thus a separate step of filling the space 60 with a gas is not needed after the bonding.

When atomic diffusion bonding technique is used, various metals such as Au, Ti, Al, and/or Ag can be used respectively for the materials of the metal layer 50a and the metal layer 50b. When a gas other than an inert gas is filled in the space 60, Au, Ar, or an alloy of Au or Ag may be preferably used for the metal layer 50a and the metal layer 50b, respectively. The thicknesses of the metal layer 50a and the metal layer 50b are respectively preferably in a range of $\lambda/2$ (where $\lambda$ is the peak wavelength of the excitation light) to 2.5 µm, more preferably in a range of 0.5 µm to 1.5 µm.

When both the fluorescent part 11 and the light-reflecting part 12 are made of sintered bodies, in order to confine light in the fluorescent part 11, the light-reflecting part 12 has a porosity preferably higher than the porosity of the fluorescent part 11. In this case, as shown in FIG. 5, the connecting member 50 (more specifically, the metal layer 50a) can be disposed not only on the lower surface of the light-reflecting part 12, but also on a peripheral portion of the lower surface of the fluorescent part 11. With this arrangement, unintentional entering of an outside gas to the space 60 or unintentional leakage of the gas that has been filled in the space 60 to the outside can be prevented or reduced.

In the example shown in FIG. 5, the wavelength converting member 10 and the light-transmissive member 20 are bonded by using the connecting member 50 made of a metal material. The metal material has a relatively high thermal conductivity, which facilitating dissipation of heat generated in the fluorescent part 11 to the light-reflecting part 12, and to the light-transmissive member 20. The wavelength converting member 10 and the light-transmissive member 20 can be bonded by using a resin material such as an epoxy resin or acrylic resin, a low-melting point glass material, or the like.

Second Embodiment

Figure 6:
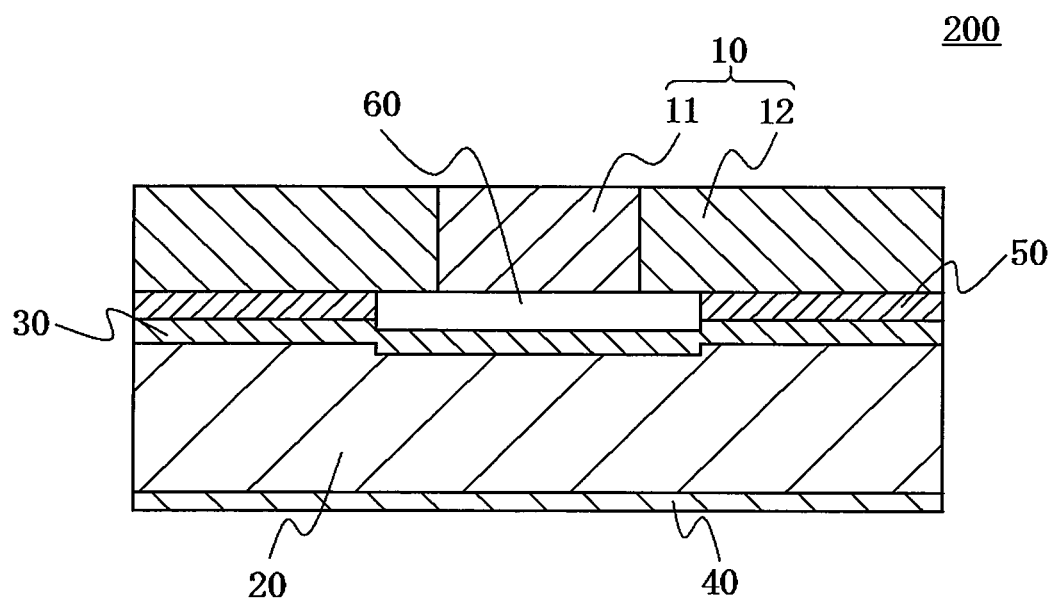
FIG. 6 is a cross-sectional view of an optical component according to a second embodiment of the present invention.

An optical component 200 according to a second embodiment will be described with reference to FIG. 6. The optical component 200 has a structure similar to the structure of the optical component 100 except for those described below.

In the optical component 200, a recess is formed in the upper surface of the light-transmissive member 20 at a region corresponding to the fluorescent part 11. With this arrangement, even if the thickness of the connecting member 50 is reduced in view of heat dissipation from the fluorescent part 11, formation of the space 60 is not be obstructed.

When a resin material or a low-melting glass material is used for the connecting member 50, the width of the recess is preferably made greater than the width of the fluorescent part 11. This is because, with this arrangement, even when the amount of the connecting member 50 fluctuates, spreading of the connecting member 50 over the light-transmissive member 20 to a region corresponding to the fluorescent part 11 can be prevented or reduced. The recess can be formed by, for example, dry etching.

Third Embodiment

An optical component 300 according to a third embodiment will be described with reference to FIG. 7. The optical component 300 has a structure similar to the structure of the optical component 100 except for those described below.

In the optical component 300, a recess is formed in the lower surface of the wavelength converting member 10. That is, the lowermost surface of the fluorescent part 11 is located higher than the lowermost surface of the wavelength converting member 10. Also with this arrangement, even if the thickness of the connecting member 50 is reduced, the space 60 of a certain thickness can be formed.

Figure 7:
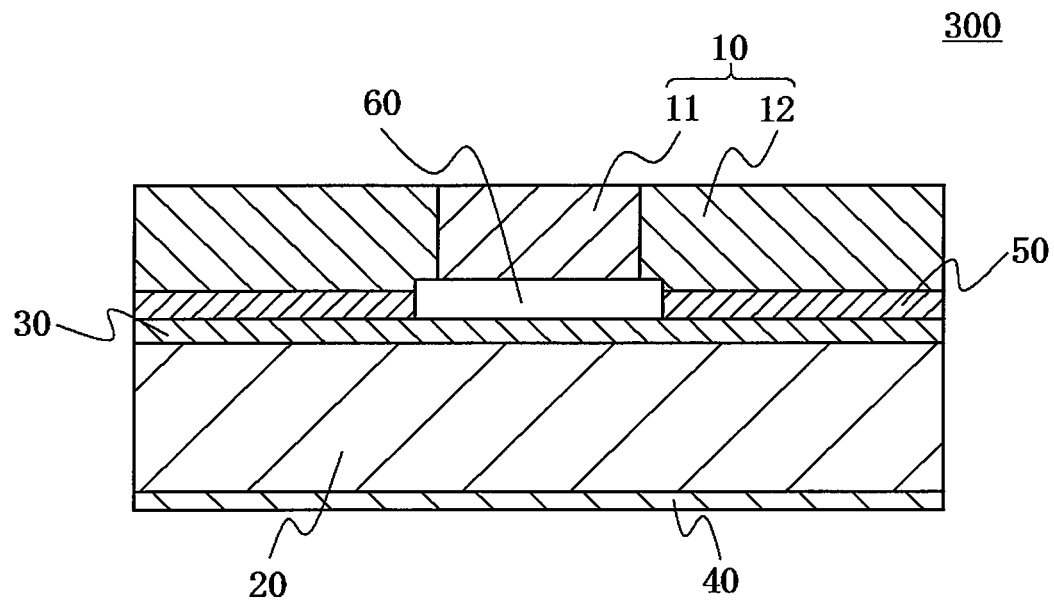
FIG. 7 is a cross-sectional view of an optical component according to a third embodiment of the present invention.

The recess may be formed only in the fluorescent part 11, but as shown in FIG. 7, the recess is preferably formed continuously in the fluorescent part 11 and the light-reflecting part 12. That is, the recess is preferably formed such that the entire lower surface of the fluorescent part 11 and a portion of the lower surface of the light-reflecting part 12 are located higher than the lowermost surface of the light-reflecting part 12. With this arrangement, when a resin material or a low-melt point glass material is used for the connecting member 50, the connecting member 50 can be prevented or reduced from locating directly under the fluorescent part 11, while securing a certain connecting area with the connecting member 50. The recess can be formed by, for example, dry etching.

In the optical component 300, a recess may be formed in the upper surface of the light-transmissive member 20, as in the optical component 200.

Fourth Embodiment

Figure 8:
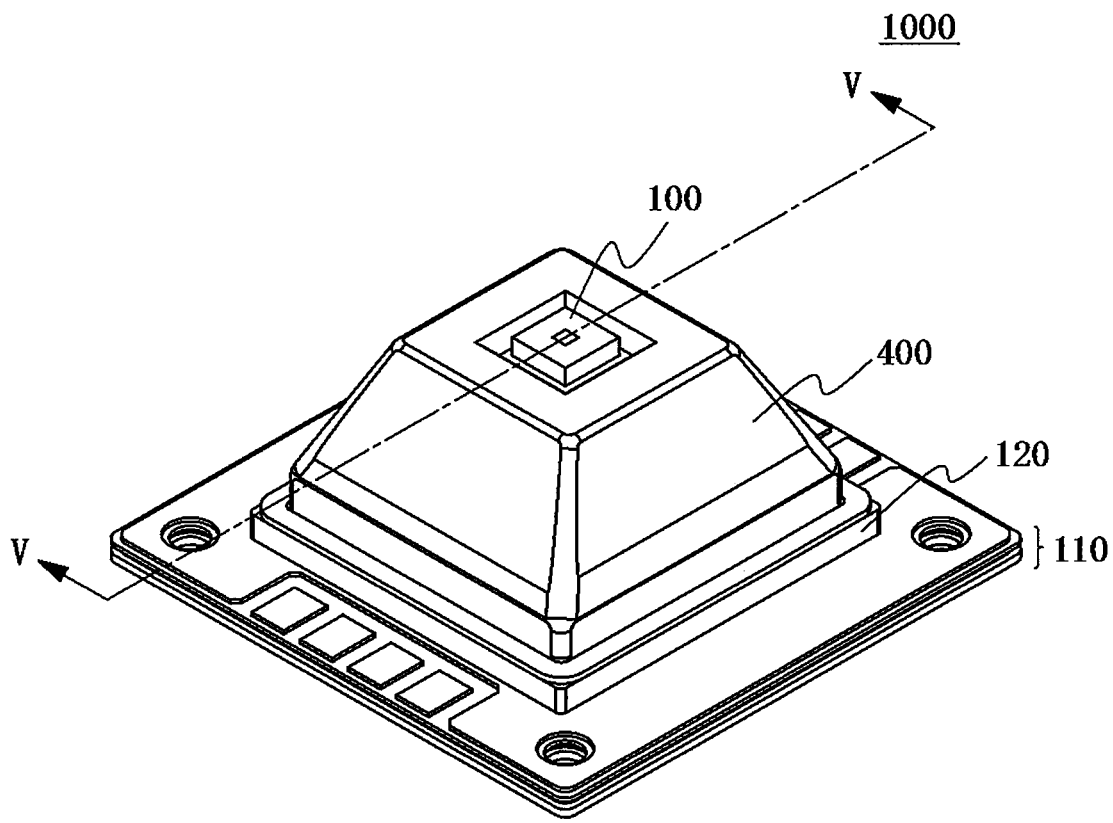
FIG. 8 is a perspective view of a light emitting device according to a fourth embodiment of the present invention.
Figure 9:
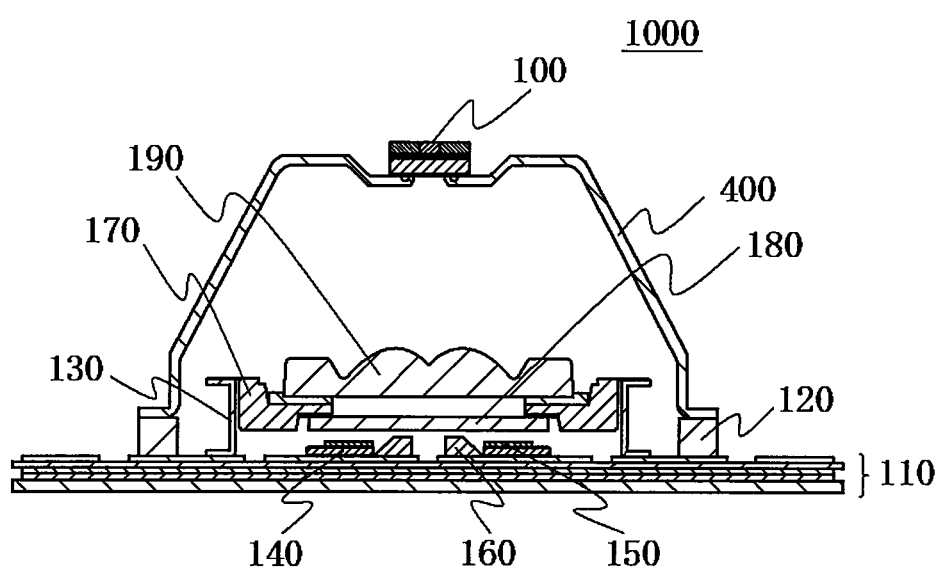
FIG. 9 is a cross-sectional view of a light emitting device according to a fourth embodiment of the present invention.

With reference to FIG. 8, and FIG. 9, a light emitting device 1000 according to a fourth embodiment will be described below. The light emitting device 1000 includes the optical component 100 according to the first embodiment, and a semiconductor laser element 150 configured to emit an excitation light to the lower surface of the light-transmissive member 20, and can be used, for example, in vehicular lighting equipment. Generally, a semiconductor laser element has a light distribution angle narrower than that of a light emitting diode, or the like, which is suitable for the use in the optical component 100 that has a relatively small fluorescent part. Also, the laser light emitted from a semiconductor laser element exhibits highly rectilinear propagation, which allows perpendicular incident of the laser light to the dielectric multilayer film 30 of the optical component 100, which allows efficient incident to the fluorescent part 11. Thus, suitable to the optical component 100 provided with the dielectric multilayer film 30. In the fourth embodiment, the optical component 100 will be used in the description below, but the optical component 200 or the optical component 300 may alternatively be used.

The light emitting device 100 includes a substrate 110 provided with a predetermined wiring, a first frame 120 disposed on an upper surface of the substrate 110, a second frame 130 disposed inward of the first frame 120, a sub-mount 140 disposed on the upper surface of the substrate 110 inward of the second frame 130, a semiconductor laser element 150 disposed on the upper surface of the sub-mount 140, a reflector 160 configured to reflect light that is an excitation light emitted from the semiconductor laser element 150 to upward, a support 170 fixed on the upper surface of the second frame 130, the first light-transmissive body 180 held by a lower surface of the support 170, a second light-transmissive body 190 held by an upper surface of the support 170, a cover 400 fixed on the upper surface of the first frame 120, and an optical component 100 fixed on an upper surface of the cover 400.

The substrate 110 has a layered structure containing a plurality of insulating layers. Electrically conductive layers are respectively disposed at predetermined locations on the upper surface and within the substrate 110. The layered structure of the substrate 110 allows for flexibility and diversity in the arrangement of the wiring. The substrate 110 may have a single-layer structure containing a single insulating layer. Examples of the materials of the insulating layer include AlN, $Si_3N_4$, SiC, $ZrO_2$, $Al_2O_3$, and sapphire.

The first frame 120 is connected to the upper surface of the substrate 110. The first frame 120 is disposed to surround the second frame 130. The first frame 120 is connected to the substrate 110 by a brazing material or the like. Examples of the materials of the first frame 120 include a single body of Cu, Al, Fe, Au, or Ag, and an alloy of those.

The second frame 130 is connected to the upper surface of the substrate 110 at a location inward of the first frame 120. The second frame 130 is disposed to surround a periphery of a region designated to dispose the semiconductor laser element 150 or the like. The second frame 130 is connected to the substrate 110 by welding or the like. Examples of the materials of the second frame 130 include a single body of Cu, Al, Fe, Au, or Ag, and an alloy of those, and in the case of connecting by welding, a single body or an alloy of Fe is preferable.

Inward of the second frame 130 on the upper surface of the substrate 110, a semiconductor laser element 150 is mounted. In the fourth embodiment, the semiconductor laser element 150 is disposed on the upper surface of the substrate 110 via a sub-mount 140. The semiconductor laser element 150 is configured to emit a laser light as an excitation light of a fluorescent material, and includes an n-side semiconductor layer, a p-side semiconductor layer, and an active layer therebetween. Examples of the semiconductor laser element 150 has a peak wavelength of the laser light in a range of 320 nm to 530 nm, typically in a range of 430 nm to 480 nm. For such semiconductor laser element 150, a semiconductor laser element that include a Group III nitride-based semiconductor can be employed. When a YAG-based fluorescent material is used as the fluorescent material, the peak wavelength of the laser light is preferably in a range of 440 nm to 470 nm.

Inward of the second frame 130 on the upper surface of the substrate 110, a reflector 160 configure to reflect the laser light upward is mounted. For the reflector 160, for example, a mirror having a reflecting film such as a dielectric multilayer film disposed on its surface can be used.

On the upper surface of the second frame 130, a support 170 configured to support the first light-transmissive body 180 and the second light-transmissive body 190 is connected. The support 170 is connected to the second frame 130 by welding or the like. The support 170 defines a through-opening to allow the laser light to pass through. Examples of the materials of the support 170 include metals such as a single body of Cu, Al, Fe, Au, or Ag, and an alloy of those, of those, a single body or an alloy of Fe is preferable.

On the lower surface of the support 170, a first light-transmissive body 180 is disposed to cover the opening of the through-hole at the lower surface side. The first light-transmissive body 180 is configured to transmit the laser light while hermetically sealing the space in which the semiconductor laser element 150 is disposed.

Examples of the materials of the first light-transmissive part 180 include glass and sapphire. The first light-transmissive part 180 can have a thickness in a range of, for example, 0.1 mm to 2 mm. For such a material, an insulating white ink which is a so-called white resist made of a silicone resin containing titanium oxide can be preferably used.

The second light-transmissive body 190 is disposed over the upper surface of the support 170 to cover the opening of the through-opening at the upper surface side. The second light-transmissive body 190 serves as a lens, which can condense light to a location near the optical component 100.

Examples of the materials of the second light-transmissive body 190 include an optical glass such as BK-7 and a transparent resin material. The second light-transmissive body 190 can have a thickness in a range of, for example, 1 mm to 5 mm.

The cover 400 is connected on the upper surface of the first frame 120. The optical component 100 is disposed above the cover 400. The cover 400 has lateral surfaces each widening downward, which increases the volume that contributes dissipation of heat. Accordingly, heat generated from the optical component 100 can be efficiently dissipated.

Examples of the materials of the cover include a single metal such as Cu, Al, Fe, Au, and Ag, or an alloy thereof. The thickness of the cover 400 is preferably in a range of 0.1 mm to 1.5 mm, more preferably in a range of 0.3 mm to 0.7 mm.

The light emitting device can also be obtained by using a light emitting diode to emit an excitation light, in combination with the optical component 100.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. An optical component for optical semiconductor, the optical component comprising:
    a wavelength converting member comprising:
        a fluorescent part having an upper surface, a lower surface, and one or more lateral surfaces, and containing a fluorescent material; and
        a light-reflecting part disposed adjacently surrounding the one or more lateral surface of the fluorescent part when viewed from above; and
    a light-transmissive member disposed below the wavelength converting member wherein:
    a dielectric multilayer film is disposed on an upper surface of the light-transmissive member at least at a region facing the fluorescent part, the dielectric multilayer film is configured to transmit an excitation light incident from below the light-transmissive member and to reflect fluorescent light emitted from the fluorescent part;
    a space is formed between the fluorescent part and the dielectric multilayer film; and
    the light-reflecting part and the light-transmissive member are connected by a connecting member made of a metal material.

2. The optical component according to claim 1, wherein the fluorescent part is made of an inorganic material.

3. The optical component according to claim 2, wherein the fluorescent part contains a yttrium aluminum garnet-based phosphor.

4. The optical component according to claim 1, wherein the light-reflecting part is made of an inorganic material.

5. The optical component according to claim 4, wherein the light-reflecting part contains alumina.

6. The optical component according to claim 5, wherein the fluorescent part contains alumina.

7. The optical component according to claim 1, wherein the light-transmissive member is made of sapphire.

8. The optical component according to claim 1, further comprising an antireflection film configured to reduce reflection of excitation light incident from below the light-transmissive member.

9. The optical component according to claim 1, wherein the space is filled with a gas.

10. A light emitting device comprising:
    the optical component according to claim 1; and
    a semiconductor laser element to emit excitation light to a lower surface of the light-transmissive member.

11. A light emitting device comprising:
an optical component for optical semiconductor, the optical component comprising:
a wavelength converting member comprising:
a fluorescent part having an upper surface, a lower surface, and one or more lateral surfaces, and containing a fluorescent material;
a light-reflecting part disposed adjacently surrounding the one or more lateral surface of the fluorescent part when viewed from above; and
a light-transmissive member disposed below the wavelength converting member: and
a semiconductor laser element to emit excitation light to a lower surface of the light-transmissive member wherein:
a dielectric multilayer film is disposed on an upper surface of the light-transmissive member at least at a region facing the fluorescent part, the dielectric multilayer film is configured to transmit an excitation light incident from below the light-transmissive member and to reflect fluorescent light emitted from the fluorescent part;
a space is formed between the fluorescent part and the dielectric multilayer film; and
the light-reflecting part and the light-transmissive member are connected by a connecting member made of a metal material.

12. The light emitting device according to claim 11, wherein the fluorescent part is made of an inorganic material.

13. The light emitting device according to claim 12, wherein the fluorescent part contains a yttrium aluminum garnet-based phosphor.

14. The light emitting device according to claim 11, wherein the light-reflecting part is made of an inorganic material.

15. The light emitting device according to claim 14, wherein the light-reflecting part contains alumina.

16. The light emitting device according to claim 15, wherein the fluorescent part contains alumina.

17. The light emitting device according to claim 11, wherein the light-transmissive member is made of sapphire.

18. The light emitting device according to claim 11, further comprising an antireflection film configured to reduce reflection of the excitation light incident from below the light-transmissive member.

19. The light emitting device according to claim 11, wherein the space is filled with a gas.

20. A method of manufacturing an optical component, the method comprising:
providing a wavelength converting member that includes:
a fluorescent part having an upper surface, a lower surface, and one or more lateral surfaces, and containing a fluorescent material; and
a light-reflecting part disposed adjacently surrounding the one or more lateral surfaces of the fluorescent part when viewed from above, and having a metal layer disposed on a lower surface of the light-reflecting part;
providing a light-transmissive member configured to be disposed below the wavelength converting member, a dielectric multilayer film disposed on an upper surface of the light-transmissive member at least at a region facing the fluorescent part, the dielectric multilayer film being configured to transmit an excitation light incident from below the light-transmissive member and to reflect fluorescent light emitted from the fluorescent part, and a metal layer disposed on the upper surface of the light-transmissive member at a region facing the light-reflecting part; and
bonding the metal layer disposed on the wavelength converting member and the metal layer disposed on the light-transmissive member by using an atomic diffusion bonding such that a space filled with a gas is formed between the dielectric multilayer film disposed on the light-transmissive member and the fluorescent part.

* * * * *